(12) United States Patent
Nishiyama

(10) Patent No.: US 10,411,087 B2
(45) Date of Patent: Sep. 10, 2019

(54) SEMICONDUCTOR CAPACITOR AND POWER SUPPLY MODULE

(71) Applicant: Murata Manufacturing Co., Ltd., Nagaokakyo-shi, Kyoto-fu (JP)

(72) Inventor: Shigeki Nishiyama, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 15/992,523

(22) Filed: May 30, 2018

(65) Prior Publication Data

US 2018/0277622 A1  Sep. 27, 2018

Related U.S. Application Data

(63) Continuation of application No. PCT/JP2016/088638, filed on Dec. 26, 2016.

(30) Foreign Application Priority Data

Feb. 22, 2016  (JP) ................. 2016-030684

(51) Int. Cl.
*H01L 49/02* (2006.01)
*H01G 4/33* (2006.01)
(Continued)

(52) U.S. Cl.
CPC ............ *H01L 28/90* (2013.01); *H01G 4/06* (2013.01); *H01G 4/33* (2013.01); *H01L 25/00* (2013.01)

(58) Field of Classification Search
None
See application file for complete search history.

(56) References Cited

U.S. PATENT DOCUMENTS 8,097,882 B2 * 1/2012 Park ................. H01L 27/1214
257/72
9,455,151 B2   9/2016 Fraunhofer-Ges Forschung
(Continued)

FOREIGN PATENT DOCUMENTS

JP   H06302463 A   10/1994
JP   2006261416 A   9/2006
(Continued)

OTHER PUBLICATIONS

International Search Report issued for PCT/JP2016/088638, dated Mar. 14, 2017.
(Continued)

*Primary Examiner* — Michelle Mandala
(74) *Attorney, Agent, or Firm* — Arent Fox LLP

(57) ABSTRACT

A semiconductor capacitor includes a semiconductor substrate having a first and second principal surfaces. A first set of one or more trenches is formed on the first principal surface and a second set of one or more trenches formed on the second principal surface. A first dielectric film is located on the first principal surface and least inner walls of the first set of one or more trenches. A second dielectric film is located on the second principal surface and least inner walls of the second set of one or more trenches. A first conductor film located on the first dielectric film. A second conductor film located on the second dielectric film. The semiconductor substrate is formed of Si, SiC, GaN, or the like. The dielectric film has a two-layer structure of $SiO_2$ and $Si_3N_4$.

13 Claims, 5 Drawing Sheets

(51) Int. Cl.
*H01L 25/00* (2006.01)
*H01G 4/06* (2006.01)

(56) References Cited

U.S. PATENT DOCUMENTS

| | | | |
|---|---|---|---|
| 9,917,146 | B2 | 3/2018 | Fraunhofer-Ges Forschung |
| 2015/0145104 | A1 | 5/2015 | Bauer et al. |
| 2016/0365408 | A1 | 12/2016 | Bauer et al. |

FOREIGN PATENT DOCUMENTS

| | | | |
|---|---|---|---|
| JP | 2014241434 A | 12/2014 | |
| JP | 2015111671 A | 6/2015 | |

OTHER PUBLICATIONS

Written Opinion of the International Searching Authority issued for PCT/JP2016/088638, dated Mar. 14, 2017.

\* cited by examiner

PRIOR ART of the dielectric film. However, when the thickness of the dielectric film is increased, the intensity of electric field concentration to an end portion of the conductor film (electrode) formed on the dielectric film also increases along with the increase in dielectric film thickness, and therefore the voltage endurance is not significantly improved. For example, even if the thickness of the dielectric film is doubled, the voltage endurance is improved only by, at most, about 1.5 times.

Further, in order to increase the thickness of the dielectric film in the semiconductor capacitor, there is a problem that the time required for forming the dielectric film is prolonged in the manufacturing process of the semiconductor capacitor.

SEMICONDUCTOR CAPACITOR AND POWER SUPPLY MODULE

CROSS REFERENCE TO RELATED APPLICATIONS

The present application is a continuation of International application No. PCT/JP2016/088638, filed Dec. 26, 2016, which claims priority to Japanese Patent Application No. 2016-030684, filed Feb. 22, 2016, the entire contents of each of which are incorporated herein by reference.

FIELD OF THE INVENTION

The present invention relates to a semiconductor capacitor, and more particularly, to a semiconductor capacitor with a high voltage endurance.

The present invention also relates to a power supply module including the semiconductor capacitor of the present invention.

BACKGROUND OF THE INVENTION

Semiconductor capacitors including a semiconductor substrate are used for on-vehicle devices, industrial devices, and the like as capacitors excellent in both voltage endurance and heat resistance.

One such semiconductor capacitor is disclosed in Japanese Patent Application Laid-Open No. 2006-261416. FIG. 5 shows a semiconductor capacitor 1000 disclosed in the foregoing application. As shown therein, the semiconductor capacitor 1000 includes a semiconductor substrate 101, formed, for example, of Si (silicon). A plurality of trenches 102 are formed on a first principal surface (the upper principal surface as viewed in FIG. 5) of the semiconductor substrate 101.

A dielectric film (insulating film) 103 is formed on an inner wall of each of the trenches 102. The dielectric film 103 is formed of, for example, an oxide film. That is, the dielectric film 103 is formed of, for example, a silicon oxide film formed by oxidizing the surface of the semiconductor substrate 101.

A conductor film (electrode) 104 is formed on the dielectric film 103. The conductor film 104 is made of, for example, a metal or polysilicon doped with impurities or the like.

Semiconductor capacitor 1000 has a structure excellent in voltage endurance and includes a material excellent in voltage endurance, and therefore it has high voltage endurance. However, it uses a material having resistance to heat and therefore it has high heat resistance.

A semiconductor capacitor has high voltage endurance and high heat resistance as described above. However, a further increase in withstand voltage of the semiconductor capacitor has been required in various devices using the semiconductor capacitor. In such devices, it is advantageous for the device to be driven at as high a voltage as possible since the power loss is reduced. For example, the semiconductor capacitor may be used as a snubber capacitor for a power supply module such as an on-vehicle device, but in an on-vehicle device or the like, it is required to be driven at a voltage as high as possible in order to suppress depletion of a battery as much as possible. With an increases in a voltage of the device, a further increase in withstand voltage has been required for the semiconductor capacitor to be used.

In order to enhance the voltage endurance of the semiconductor capacitor, it is known to increase the thickness of

BRIEF DESCRIPTION OF THE INVENTION

The present invention has been made to solve the above-mentioned conventional problems.

In accordance with one aspect of the invention, a semiconductor capacitor includes a semiconductor substrate having a first and second principal surfaces. A first set of one or more trenches is formed on the first principal surface and a second set of one or more trenches formed on the second principal surface. A first dielectric film is located on the first principal surface and least inner walls of the first set of one or more trenches. A second dielectric film is located on the second principal surface and least inner walls of the second set of one or more trenches. A first conductor film located on the first dielectric film. A second conductor film located on the second dielectric film.

The semiconductor substrate is preferably made of any one of Si, SiC and GaN and preferably includes a plurality of layers. In one aspect of the invention, each of the dielectric films comprises a first layer made of $SiO_2$ and the second layer made of $Si_3N_4$.

In a preferred embodiment, the first and second principal surfaces oppose one another. More particularly, they are parallel to and spaced from one another.

In a preferred embodiment, the first and second dielectric films cover the entire first and second principal surfaces, respectively. In a more preferred embodiment, the first dielectric film covers all inner walls of the first set of one or more trenches and the second dielectric film covers all inner walls of the second set of one or more trenches.

In the preferred embodiment, first and second external electrodes are located on the first and second conductive films, respectively. In a preferred embodiment the first and second conductor films and the first and second external electrodes do not extend to outer peripheral edges of the semiconductor capacitor and respective insulating films are located on the first and second dielectric films, respectively at locations between the first and second external electrodes and the outer peripheral edges of the semiconductor capacitor, respectively.

In another aspect of the invention, the invention is directed towards a power supply module comprising a semiconductor switching element and the capacitor described above connected in parallel to the semiconductor switching element.

Since the semiconductor capacitor of the present invention has high voltage endurance, in this case, a voltage of the power supply module can be increased and the power loss of the power supply module can be reduced. In addition, since the semiconductor capacitor has high heat resistance, it can be arranged in the immediate vicinity of a semiconductor switching element that generates high heat. As a result, since a wiring of the semiconductor capacitor can be shortened, the power supply module can be reduced in equivalent series inductance (ESL).

In the semiconductor capacitor of the present invention, a trench is formed on each of a first principal surface and a second principal surface of a semiconductor substrate, and a dielectric film and a conductor film are formed on an inner wall of the trench, so that the semiconductor capacitor has an equivalent circuit in which two capacitors are connected in series, and therefore it has high voltage endurance.

DETAILED DESCRIPTION OF THE INVENTION

Figure 1:
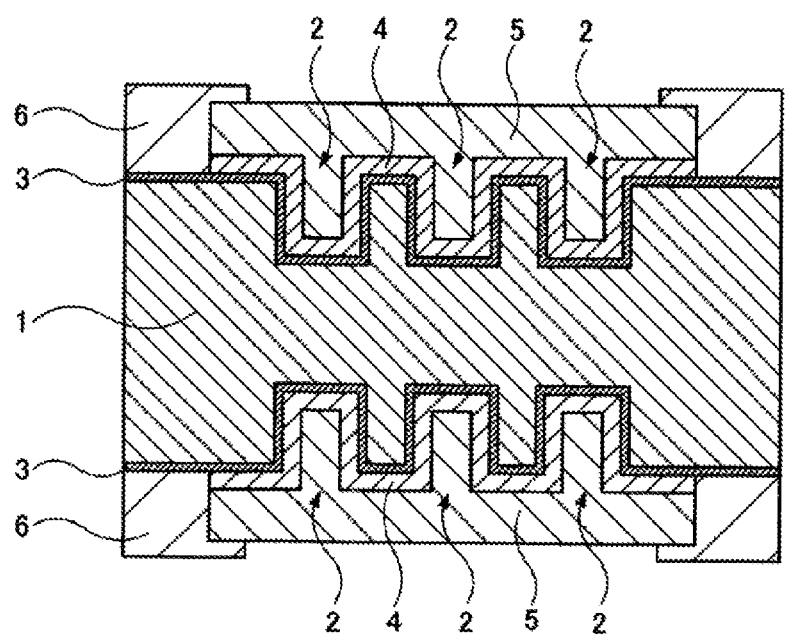
FIG. 1 is a cross-sectional view showing a semiconductor capacitor 100 according to a first embodiment of the invention.

Hereinafter, embodiments for carrying out the present invention will be described with reference to the drawings.

Each embodiment illustratively shows embodiments of the present invention, and the present invention is not limited to the description of the embodiments. Further, the drawings are for helping the understanding of the embodiments, and there may be cases where the drawings are not necessarily drawn strictly. For example, the ratio of the sizes of a constituent element or between constituent elements drawn may not correspond to the ratios of those dimensions as described in the specification. In addition, the constituent elements described in the specification may be omitted in the drawings, or the number of the constituent elements drawn may be reduced, and the like.

First Embodiment

FIG. 1 shows a cross-sectional view of a semiconductor capacitor 100 according to a first embodiment of the present invention. The semiconductor capacitor 100 includes a semiconductor substrate 1 made, for example, of Si. However, a material of the semiconductor substrate 1 is optional and may be, for example, SiC, GaN or the like.

The semiconductor substrate 1 has a flat plate shape including a first principal surface (the upper principal surface as viewed in FIG. 1) and a second principal surface (the lower principal surface as viewed in FIG. 1). In the present embodiment, each of the first and second principal surfaces has a rectangular shape. However, the shapes of the first and second principal surfaces are not so limited and may be, for example, a circular shape instead of a rectangular shape.

In the present embodiment, a thickness of the semiconductor substrate 1 was set to 600 μm. Further, the sizes in the planar direction were set to 5 mm in length and 5 mm in width. However, the invention is not limited to these sizes and can be appropriately changed depending on the number, depth and the like of a trench 2 to be described later. The conductivity of the semiconductor substrate 1 is adjusted to a desired value by selecting the material or performing doping as required.

A plurality of trenches 2 are formed on each of the first and second principal surfaces of the semiconductor substrate 1. In the present embodiment, two-hundred thousand trenches 2 are formed on each of the first and second principal surfaces. Each of the trenches 2 has a columnar (cylindrical) shape having a diameter of 5 μm and a depth of 20 μm. However, the number, shape, size, interval, and the like of the trenches 2 are not so limited and can be appropriately changed in accordance with a capacity value or the like to be required. For example, the shape of the trench 2 may be a polygonal prism shape such as a quadrangular prism shape, a pentagonal prism shape, a hexagonal prism shape, or the like.

A respective dielectric film 3 is formed on the first and second principal surfaces of the semiconductor substrate including the inner walls of the trenches 2. Although not shown in the drawing because it is difficult to see, each dielectric film 3 is formed in a two-layer structure in the present embodiment.

Each dielectric film includes a first layer made of $SiO_2$ and a second layer made of $Si_3N_4$. The first ($SiO_2$) layer has a thickness of 100 nm and is formed by thermally oxidizing Si on the surface of the semiconductor substrate 1. This layer is provided for enhancing the bonding strength between the semiconductor substrate 1 made of Si and the second $Si_3N_4$ layer. The thickness of the second $Si_3N_4$ layer is 1.1 μm and causes the semiconductor capacitor 100 to exhibit a capacity together with the first $SiO_2$ layer.

While the foregoing structure of the dielectric film is one example of a dielectric film used in the present invention, the invention is not so limited. Other structures, materials, thicknesses, and the like can be used. For example, the dielectric film 3 may be formed as a single layer structure made of one type of material.

A respective conductor film 4 is formed on respective dielectric films 3 located on the first and second principal surface) of the semiconductor substrate 1 (including the inner walls of the trenches 2), respectively. In the present embodiment, the conductor film 4 has a thickness of 500 nm and is formed of polysilicon. However, the material, thickness, formation region and the like of the conductor film 4 are not so limited and can be appropriately changed.

A respective external electrode 5 is formed on respective conductor films 4 formed on the first and second principal surfaces (including the inner walls of the trenches), respectively. In the present embodiment, the external electrode 5 has a thickness of 6 μm and is formed of Al. However, the material, thickness, formation region and the like of the external electrode 5 are optional and can be appropriately changed.

A respective insulator film 6 is formed around the external electrodes 5 formed on the first and second principal surfaces of the semiconductor substrate 1, respectively. The insulator film 6 includes a polyimide resin, an epoxy resin, or the like and suppresses the occurrence of unexpected discharge through an edge portion of the external electrodes 5 by covering the edge portion of the external electrodes 5.

The semiconductor capacitor 100 having the above structure according to the first embodiment has an equivalent circuit in which a capacitor, a resistor (a resistor based on a resistance component of the semiconductor substrate 1), and a capacitor are connected in series between a pair of external electrodes 5. The semiconductor capacitor 100 has high voltage endurance since two capacitors are connected in series.

The semiconductor capacitor 100 having the above structure according to the first embodiment can be manufactured, by way of example, in accordance with the method shown in FIG. 2(A) to FIG. 2(F).

Figure 2:
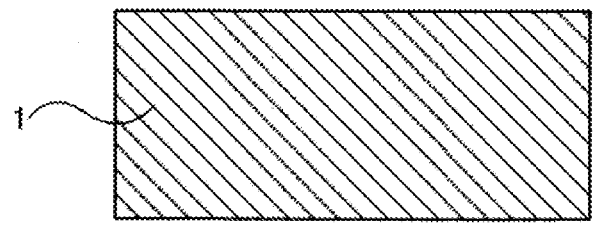
FIG. 2(A) to FIG. 2(F) are cross-sectional views showing each of steps performed in an example of a manufacturing method of the semiconductor capacitor 100.
Figure 2:
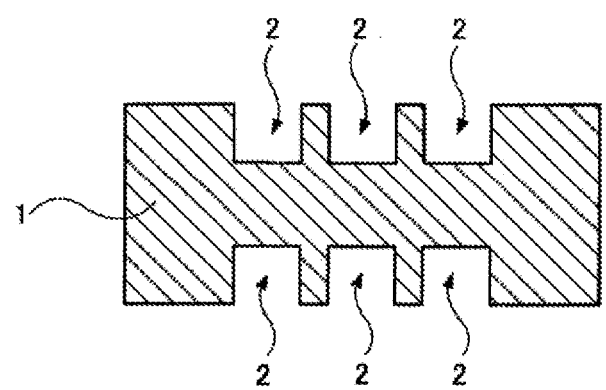
Figure 2:
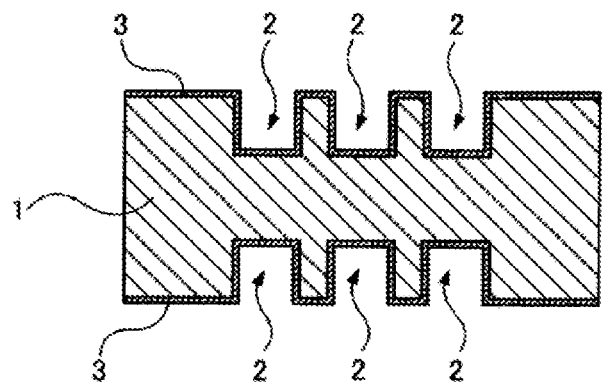
Figure 2:
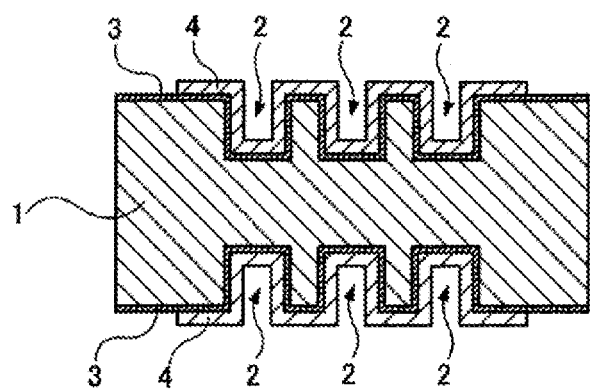
Figure 2:
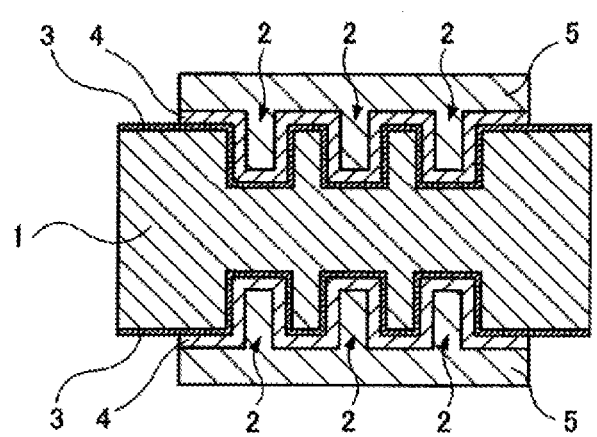
Figure 2:
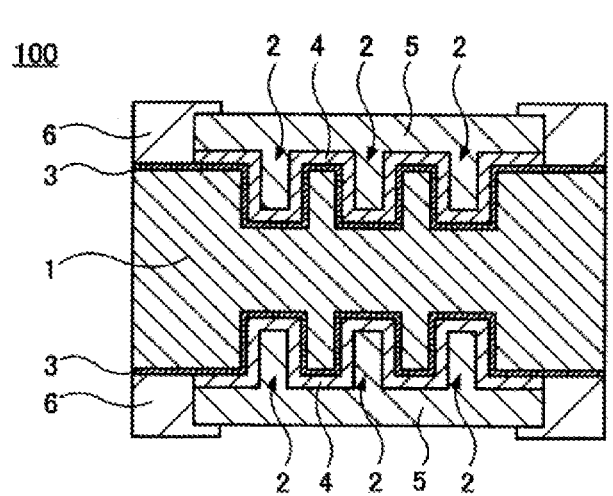

First, as shown in FIG. 2(A), a semiconductor substrate 1 is prepared. Typically, the semiconductor substrate 1 is prepared as a substrate wafer (not shown) which includes a plurality of semiconductor substrates 1 and is divided into individual products at a predetermined stage in the manufacturing process. However, in FIG. 2(A) to FIG. 2(F), only one semiconductor substrate 1 is shown for easy viewing.

Next, as shown in FIG. 2(B), trenches 2 are formed on each of the first and second principal surfaces of the semiconductor substrate 1. The trenches 2 are formed, for example, by using a lithography technique.

Next, as shown in FIG. 2(C), a respective dielectric film 3 is formed on each of the first and second principal surfaces of the semiconductor substrate 1 including on the inner walls of the trenches 2. As described above, in the present embodiment, the dielectric film 3 is formed as a two-layer structure, the first layer being made of $SiO_2$ and the second layer being made of $Si_3N_4$. First, the first layer made of $SiO_2$ is formed by thermally oxidizing Si of the surface of the semiconductor substrate 1. Subsequently, the second layer made of $Si_3N_4$ is formed by, for example, CVD (chemical vapor deposition).

In addition, formation of the first layer made of $SiO_2$ formed by thermal oxidation and formation of the second layer made of $Si_3N_4$ formed by CVD can both be performed simultaneously on the first and second principal surfaces of the semiconductor substrate 1. In the conventional method of increasing the thickness of the dielectric film in order to improve the voltage endurance described above, there is a problem that the time required for forming the dielectric film is prolonged by a time period corresponding to the desired increase in the thickness of the dielectric film. In contrast, according to the manufacturing method of the present embodiment, since the dielectric film 3 on the first principal surface and the dielectric film 3 on the second principal surface can be formed simultaneously, the voltage endurance of the semiconductor capacitor 100 can be improved without unnecessarily prolonging the manufacturing time.

Next, as shown in FIG. 2(D), respective conductor films 4 are formed on the respective dielectric films 3 located on the first and second principal surfaces (including the inner walls of the trenches 2) of the semiconductor substrate 1, respectively. The conductor film 4 is formed, by way of example, using a chemical vapor deposition (CVD) method. The CVD is typically performed by covering a predetermined region with a mask and the conductor film 4 is not formed in the vicinity of the outer edges of the first and second principal surfaces of the semiconductor substrate 1.

Next, as shown in FIG. 2(E), a pair of external electrodes 5 are formed on the respective conductor films 4 (including the portions of the conductor films located in the trenches 2). The external electrode 5 may be formed of, for example, Al.

Next, as shown in FIG. 2(F), respective insulator films 6 are formed around the external electrodes 5. The insulator films 6 are formed, for example, of a polyimide resin.

The preceding steps are preferably performed in a state of a substrate wafer including a plurality of semiconductor substrates 1, and finally, although not shown, the substrate wafer is divided into individual products to complete the semiconductor capacitor 100 according to the first embodiment.

[Comparison of Voltage Endurance]

The voltage endurance of the semiconductor capacitor 100 according to the first embodiment is compared to the voltage endurance of a semiconductor capacitors 1100 according to Comparative Examples 1 and 2, each of which have a conventional structure.

Figure 3:
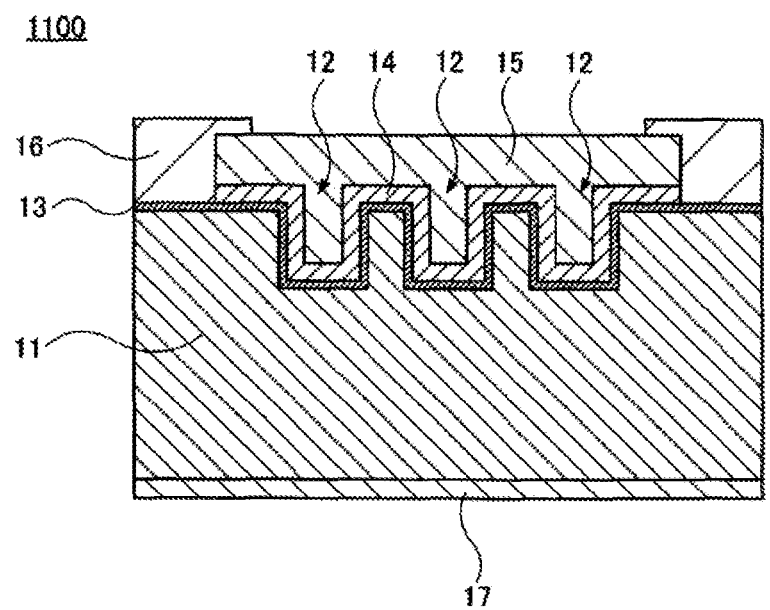
FIG. 3(A) is a cross-sectional view showing a semiconductor capacitor 1100 according to Comparative Example 1.
FIG. 3(B) is a cross-sectional view showing a semiconductor capacitor 1200 according to Comparative Example 2.
Figure 3:
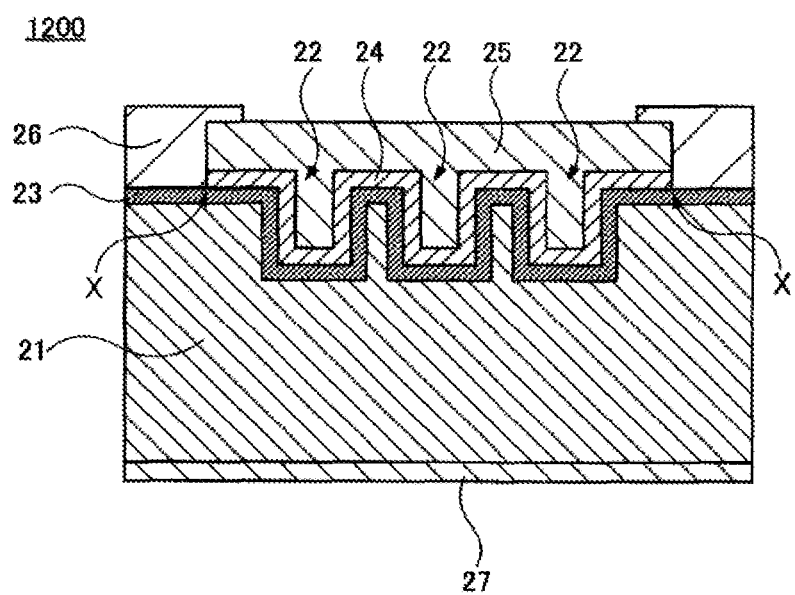

FIG. 3(A) shows a cross sectional view of the semiconductor capacitor 1100 of Comparative Example 1. FIG. 3(B) shows a cross sectional view of the semiconductor capacitor 1200 of Comparative Example 2.

In the semiconductor capacitor 1100 of Comparative Example 1, trenches 12, a dielectric film 13, a conductor film 14, an external electrode 15, and an insulator film 16 are formed only on the first principal surface (the upper principal surface as viewed in FIG. 3(A)). The trenches 12, dielectric film 13, conductor film 14, external electrode 15, and insulator film 16 of the semiconductor capacitor 1100 are formed in the same conditions as those of the trenches 2, dielectric film 3, conductor film 4, external electrode 5, and insulator film 6 of the semiconductor capacitor 100 of the first embodiment described above. That is, the dielectric film 13 of the semiconductor capacitor 1100 has the same structure, material and thickness as those of the dielectric film 3 of the semiconductor capacitor 100. An external electrode 17 for mounting is formed on the second principal surface (the lower principal surface as viewed in FIG. 3(A)) of the semiconductor capacitor 1100.

In the semiconductor capacitor 1200 of Comparative Example 2, trenches 22, a dielectric film 23, a conductor film 24, an external electrode 25, and an insulator film 26 are formed only on the first principal surface (the upper principal surface as viewed in FIG. 3(B)). The structure and material of the dielectric film 23 of the semiconductor capacitor 1200 are the same as the structure and material of the dielectric film 3 of the semiconductor capacitor 100 of the first embodiment. That is, the dielectric film 23 of the semiconductor capacitor 1200 is formed in a two-layer structure in which the first layer is made of $SiO_2$ and the second layer is made of $Si_3N_4$. However, the thicknesses of the first and second layers of the dielectric film 23 of the semiconductor capacitor 1200 are respectively formed twice as large as the thicknesses of the first layer and second layers of the dielectric film 3 of the semiconductor capacitor 100 of the above embodiment of the present invention. The other constituent elements of the semiconductor capacitor 1200, namely, the trench 22, the conductor film 24, the external electrode 25, and the insulator film 26 are formed in the same conditions as those of the trenches 2, dielectric film 3, conductor film 4, external electrode 5, and insulator film 6 of the semiconductor capacitor 100. An external electrode 27 for mounting is formed on the second principal surface (the lower principal surface as viewed in FIG. 3(B)) of the semiconductor capacitor 1200.

The withstand voltage of the semiconductor capacitor 100 according to the first embodiment, the withstand voltage of the semiconductor capacitor 1100 according to Comparative Example 1, and the withstand voltage of the semiconductor capacitor 1200 according to Comparative Example 2 are shown in Table 1. However, each withstand voltage is a theoretical value.

TABLE 1

|  | Semiconductor Capacitor 1100 according to Comparative Example 1 | Semiconductor Capacitor 1200 according to Comparative Example 2 | Semiconductor Capacitor 100 according to First Embodiment |
|---|---|---|---|
| Forming Position of Dielectric Film | Only first principal surface of semiconductor substrate | Only first principal surface of semiconductor substrate | First principal surface and second principal surface of semiconductor substrate |
| Thickness of Dielectric Film | a | a × 2 | a |
| Withstand Voltage (V) | 100 | 140-150 | 200 |

In the case where each of the thickness of each of the dielectric films 3 of the semiconductor capacitor 100 of the first embodiment and the thickness of the dielectric film 13 of the semiconductor capacitor 1100 of Comparative Example 1 is taken as a (μm), the thickness of the dielectric film 23 of the semiconductor capacitor 1200 of Comparative Example 2 is a ×2 (μm).

Assuming that the withstand voltage of the semiconductor capacitor 1100 of Comparative Example 1 is set to 100 (V), the withstand voltage of the semiconductor capacitor 100 of the first embodiment is 100×2=200 (V). The reason for this is that the semiconductor capacitor 100 is equivalent to connecting of the two semiconductor capacitors 1100 in series.

In contrast, in the semiconductor capacitor 1200 of Comparative Example 2, although the thickness of the dielectric film 23 is twice as large as the thickness of the dielectric film 13 of the semiconductor capacitor 1100 of Comparative Example 1, the withstand voltage is not twice as large as that of the semiconductor capacitor 1100 of Comparative Example 1 and is improved only to about 140 to 150 (V). That is, at most, the withstand voltage of the semiconductor capacitor 1200 of Comparative Example 2 is improved only to about 1.5 times as large as the semiconductor capacitor 1100 of Comparative Example 1. The reason for this is that, by increasing the thickness of the dielectric film 23, the intensity of electric field concentration at the end portion of the conductor film 24 indicated by the symbol X in FIG. 4(B) is increased, and as a result, the improvement of the voltage endurance is lessened.

As described above, according to the semiconductor capacitor 100 of the first embodiment, it is possible to effectively improve the voltage endurance. In the semiconductor capacitor 100, as described above, since the dielectric film 3 on the first principal surface and the dielectric film 3 on the second principal surface can be formed simultaneously, the manufacturing time for the semiconductor capacitor 100 is not prolonged in order to improve the voltage endurance.

Second Embodiment

Figure 4:
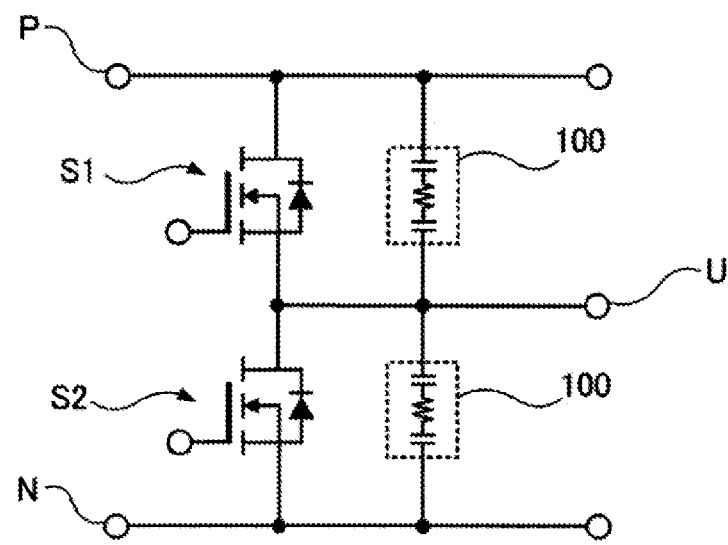
FIG. 4 is an equivalent circuit diagram showing a power supply module 200 according to a second embodiment.
Figure 5:
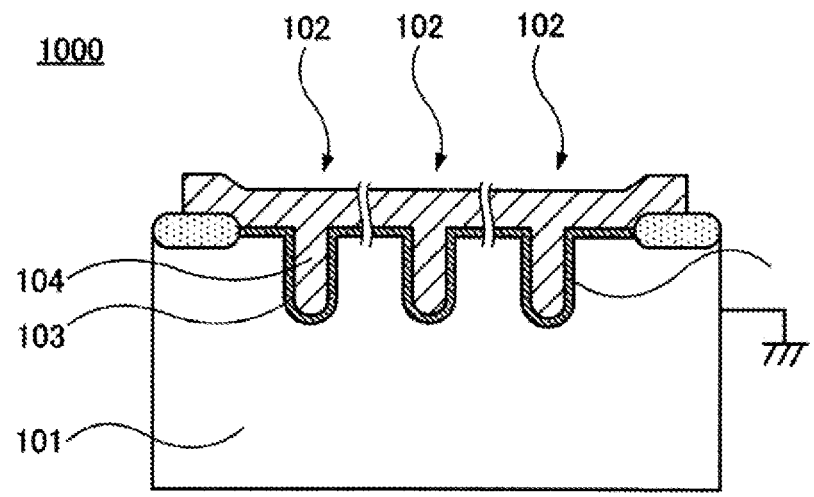
FIG. 5 is a cross-sectional view showing a conventional semiconductor capacitor 1000 disclosed in Patent Document 1 (Japanese Patent Application Laid-Open No. 2006-261416).

FIG. 4 is an equivalent circuit diagram of a power supply module 200 according to a second embodiment of the present invention. The power supply module 200 is prepared using the semiconductor capacitor 100 according to the first embodiment.

The power supply module 200 includes a P-side terminal P, an N-side terminal N, and an intermediate terminal U. Two semiconductor switching elements S1, S2 are connected in series between the P-side terminal P and the N-side terminal N. Furthermore, a connection point between the semiconductor switching element S1 and the semiconductor switching element S2 is connected to the intermediate terminal U.

In the power supply module 200, a respective semiconductor capacitor 100 according to the first embodiment is connected in parallel to each of the semiconductor switching elements S1 and S2. Each semiconductor capacitor 100 is connected as a snubber capacitor and plays a role of reducing parasitic inductance or parasitic resistance generated in wiring, wire bonding and the like at the time of switching of the semiconductor switching elements S1 and S2 to lower noise.

In FIG. 4, each semiconductor capacitor 100 is represented by an equivalent circuit in which a capacitor, a resistor, and a capacitor are connected in series. The two capacitors represent a first capacitor formed on the first principal surface of the semiconductor substrate 1 and a second capacitor formed on the second principal surface. The resistor represents resistance due to the resistance component of the semiconductor substrate 1.

In the power supply module 200, semiconductor switching elements S1 and S2 generate extremely high temperature heat. However, since the semiconductor capacitor 100 according to the first embodiment has high heat resistance, a respective semiconductor capacitor 100 can be arranged in the immediate vicinity of the semiconductor switching elements S1 and S2. As a result, the wiring of the semiconductor capacitor 100 can be shortened and the ESR of the power supply module 200 can be lowered.

In addition, since the semiconductor capacitor 100 according to the first embodiment, which is used for the power supply module 200, has a high withstand voltage, the voltage of the power supply module 200 can be set high. As a result, the power supply module 200 has low power loss and high efficiency.

The semiconductor capacitor 100 according to the first embodiment and the power supply module 200 according to the second embodiment have been described above. However, the present invention is not limited to the description above, and various modifications can be made in accordance with the purport of the invention.

For example, in the case of the semiconductor capacitor, the material, shape, and size of each constituent element, and the number of the constituent elements, and the like are optional, and are not limited to the description above.

In the power supply module, the equivalent circuit is optional, and is not limited to the description above.

DESCRIPTION OF REFERENCE SYMBOLS

1: Semiconductor substrate
2: Trench
3: Dielectric film
4: Conductor film
5: External electrode
6: Insulator film
100: Semiconductor capacitor
S1, S2: Semiconductor switching element
200: Power supply module

The invention claimed is:
1. A semiconductor capacitor comprising:
   a semiconductor substrate having a first and second principal surfaces;
   a first set of one or more trenches formed on the first principal surface;

a second set of one or more trenches formed on the second principal surface;

a first dielectric film located on the first principal surface and least inner walls of the first set of one or more trenches, the first dielectric film covering the entire first principal surface and all inner walls of the first set of one or more trenches;

a second dielectric film located on the second principal surface and least inner walls of the second set of one or more trenches, the second dielectric film covering the entire second principal surface and all inner walls of the second set of one or more trenches;

a first conductor film located on the first dielectric film;

a second conductor film located on the second dielectric film; and first and second external electrodes located on the first and second conductive films, respectively;

wherein the first and second conductor films and the first and second external electrodes do not extend to outer peripheral edges of the semiconductor capacitor.

2. The semiconductor capacitor according to claim 1, wherein the semiconductor substrate is made of any one of Si, SiC and GaN.

3. The semiconductor capacitor according to claim 1, wherein each of the dielectric films comprises a plurality of layers.

4. The semiconductor capacitor according to claim 1, wherein each of the dielectric films comprises a first layer made of $SiO_2$ and the second layer made of $Si_3N_4$.

5. The semiconductor capacitor according to claim 1, wherein the first and second principal surfaces oppose one another.

6. The semiconductor capacitor according to claim 5, wherein the first and second principal surfaces are parallel to and spaced from one another.

7. The semiconductor capacitor according to claim 1, further comprising respective insulating films located on the first and second dielectric films, respectively and at locations between the first and second external electrodes and the outer peripheral edges of the semiconductor capacitor, respectively.

8. A power supply module comprising:

a semiconductor switching element; and a capacitor in accordance with claim 1 connected in parallel to the semiconductor switching element.

9. The power supply module according to claim 8, wherein the semiconductor substrate is made of any one of Si, SiC and GaN.

10. The power supply module according to claim 8, wherein each of the dielectric films comprises a plurality of layers.

11. The power supply module according to claim 8, wherein each of the dielectric films comprises a first layer made of $SiO_2$ and the second layer made of $Si_3N_4$.

12. The power supply module according to claim 8, wherein the first and second principal surfaces oppose one another.

13. The power supply module according to claim 12, wherein the first and second principal surfaces are parallel to and spaced from one another.

* * * * *